United States Patent [19]

Garverick et al.

[11] Patent Number: 4,887,240
[45] Date of Patent: Dec. 12, 1989

[54] STAGGERED REFRESH FOR DRAM ARRAY

[75] Inventors: Timothy L. Garverick, Santa Clara; Farid A. Yazdy, San Francisco; Richard D. Henderson, Sunnyvale; Webster B. Meier, Palo Alto, all of Calif.

[73] Assignee: National Semiconductor Corporation, Santa Clara, Calif.

[21] Appl. No.: 132,997

[22] Filed: Dec. 15, 1987

[51] Int. Cl.[4] .................. G11C 13/00; G11C 11/40
[52] U.S. Cl. .................. 361/222; 365/230.01; 365/230.03; 365/230.05; 365/189.04
[58] Field of Search .......... 365/222, 230, 233, 230.01, 365/230.03, 230.04, 230.05, 189.04; 364/200, 900

[56] References Cited

U.S. PATENT DOCUMENTS

| | | | |
|---|---|---|---|
| 4,249,247 | 2/1981 | Patel | 365/222 |
| 4,639,858 | 1/1987 | Murray, Jr. et al. | 365/222 |
| 4,701,843 | 10/1987 | Cohen | 365/222 |
| 4,754,425 | 1/1988 | Bhadriraju | 365/222 |
| 4,796,232 | 1/1989 | House | 365/222 |

Primary Examiner—Terrell W. Fears
Attorney, Agent, or Firm—Limbach, Limbach & Sutton

[57] ABSTRACT

According to the present invention, each successive refresh to the multiple banks of a DRAM array is staggered by one clock period. Thus, the time required to refresh one row in each DRAM of each bank at 10 MHz, for example, is equal to 0.7 μsec., or 4.4% of the total allowable maximum time between refresh cycles. This staggered refresh technique avoids large power supply current spikes while minimizing the effect on memory access bandwidth.

7 Claims, 2 Drawing Sheets

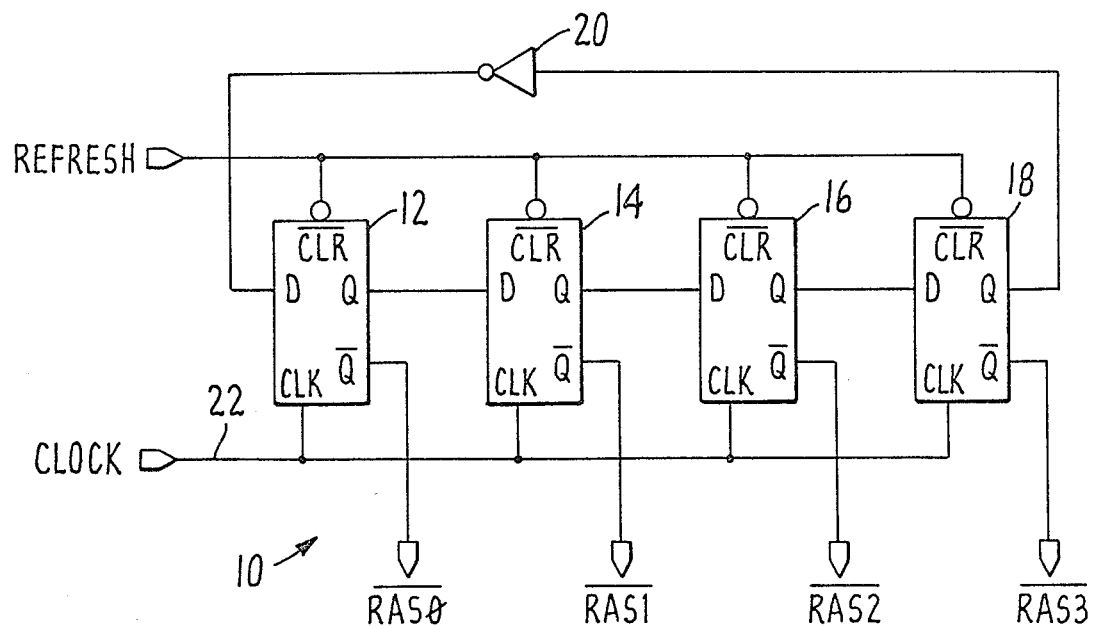
FIG_3.
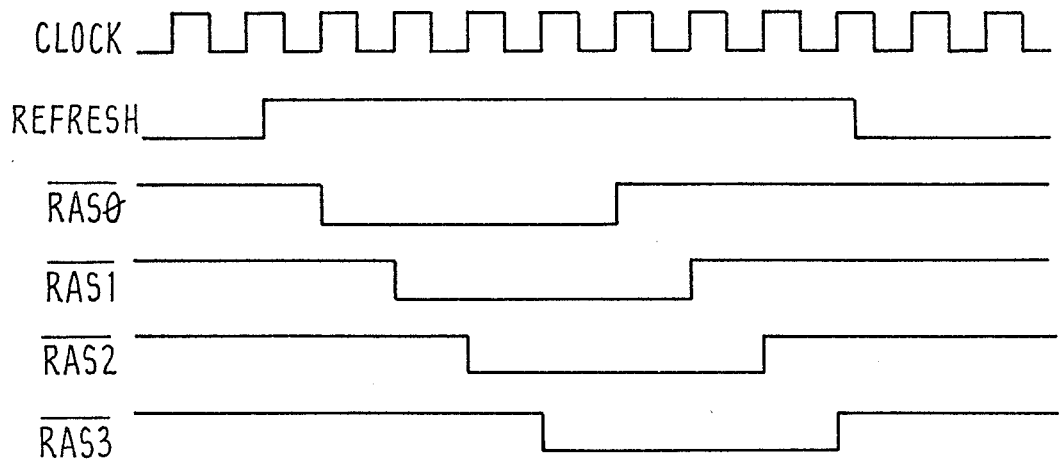
FIG_4.

STAGGERED REFRESH FOR DRAM ARRAY

BACKGROUND OF THE INVENTION

1. Field of the Invention

The present invention relates to a method of and circuitry for staggering the refresh signals to a dynamic random access memory (DRAM) to avoid large power supply current spikes while simultaneously minimizing the effect on memory access bandwidth.

2. Discussion of the Prior Art

The memory cells of a dynamic RAM (DRAM) are, basically, charged storage capacitors with driver transistors. The presence or absence of charge in a particular memory cell capacitor is interpreted by the DRAM's sense line as a logical 1 or 0. However, because of the natural tendency of the charge in the cell to distribute itself into a lower energy-state configuration, DRAM cells require periodic charge "refreshing" to maintain stored data.

This refresh requirement means that additional DRAM control circuitry must be implemented. Since the refresh procedures make the DRAM unavailable for writing or reading during the refresh cycles, memory control circuitry is required to arbitrate memory access. Furthermore, as shown in FIG. 1, in large DRAM arrays, the conventional method of refreshing all DRAM banks at the same time can cause severe power supply glitches.

Referring to FIG. 2, one obvious method for solving the large current spike problem associated with simultaneous refresh is to refresh sequentially, i.e., one DRAM bank at a time. This requires, however, in the case of four DRAM banks as illustrated in FIG. 2, that four refresh cycles be performed every 16 μsec., the maximum allowable time between refresh cycles in order to refresh every row in the DRAM within the required amount of time. Since each refresh typically requires 400 nsec. to complete (at 10 MHz), sequential refresh requires 4×400 nsec., or 1.6 μsec., each 16 microseconds in order to refresh all banks. Thus, refresh is being performed 10% of the time, seriously decreasing memory access bandwidth.

SUMMARY OF THE INVENTION

According to the present invention, each successive refresh signal to the multiple banks of a DRAM array is staggered by only one clock period. Thus, the time required to refresh one row in each bank of a four bank DRAM array at 10 MHz, for example, is equal to 0.7 μsec., or 4.4% of the total available access and refresh time. Therefore, the staggered refresh technique of the present invention reduces current spikes to the same degree as the sequential approach described above, but results in 56% less time being devoted to refresh, a significant improvement in memory access bandwidth.

DESCRIPTION OF THE DRAWINGS

FIG. 3 is a schematic diagram illustrating a circuit embodiment of the staggered refresh technique of the present invention.

FIG. 4 is a timing diagram illustrating the staggered refresh signals generated by the FIG. 3 circuit.

DESCRIPTION OF THE INVENTION

Figure 1:
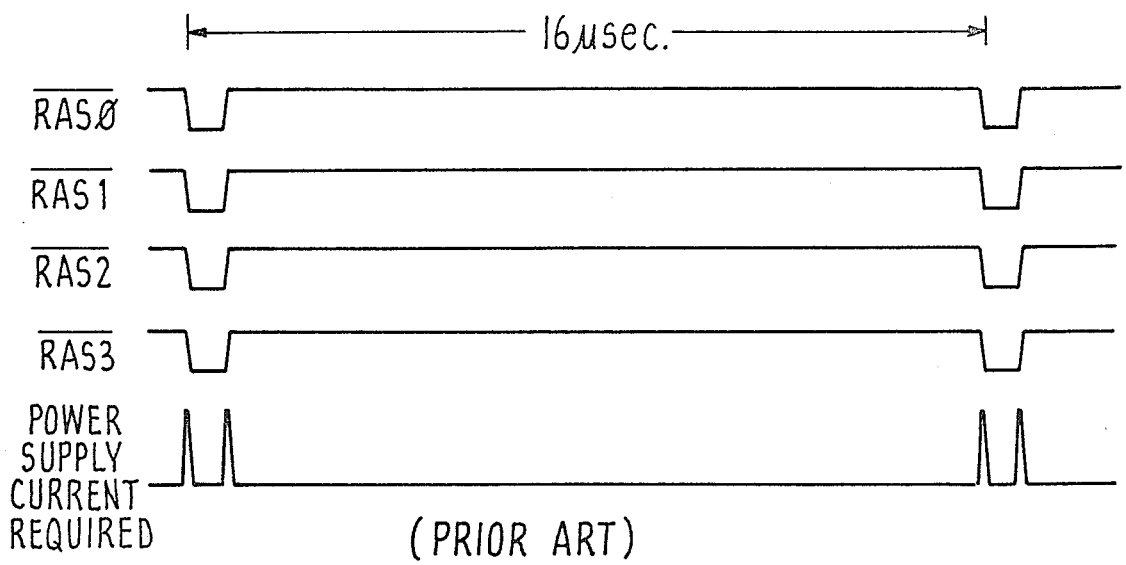
FIG. 1 is a timing diagram illustrating the current spikes generated in conjunction with conventional simultaneous refresh techniques.
Figure 2:
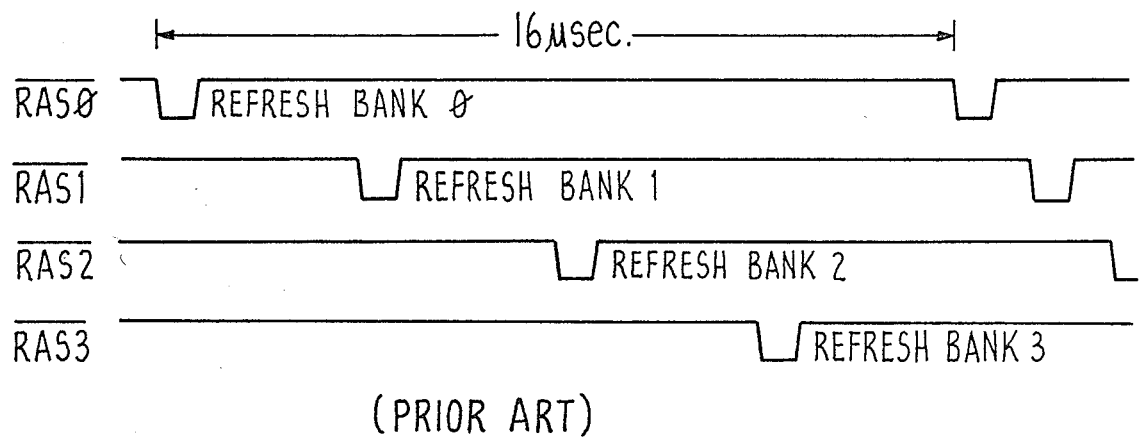
FIG. 2 is a timing diagram illustrating the decrease in memory access bandwidth associated with conventional sequential refresh techniques.
Figure 5:
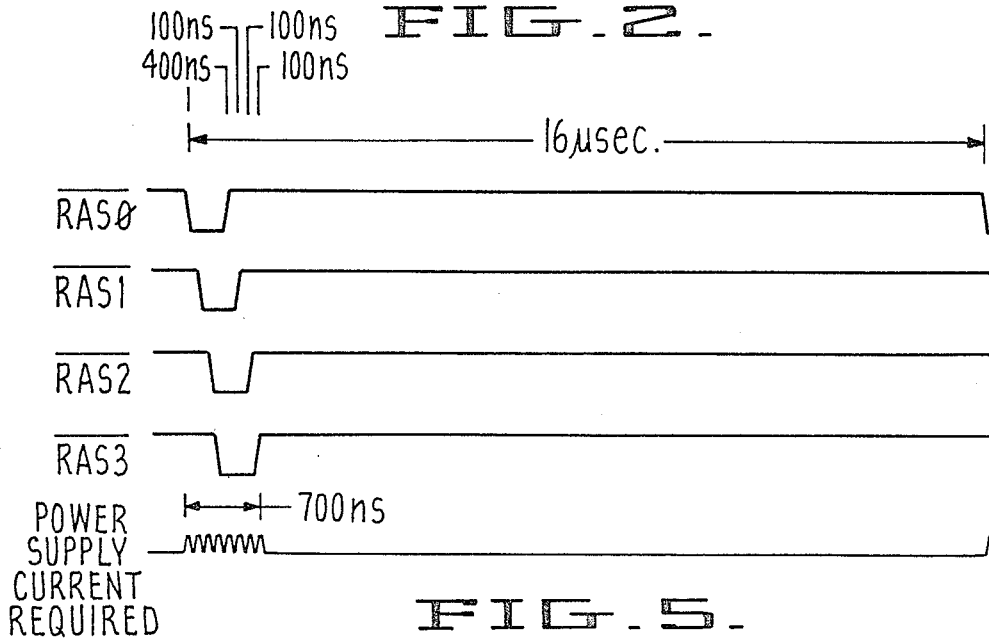
FIG. 5 is a timing diagram illustrating the current spikes and time required for refresh in accordance with the present invention.

FIGS. 3 and 4 illustrate a staggered refresh circuit 10 in accordance with the present invention and its associated timing diagram, respectively.

The staggered refresh circuit 10 illustrated in FIG. 3 includes four series-connected edge-triggered D-type flip-flops 12, 14, 16 and 18 which transfer the data input D to the Q and $\overline{Q}$ output on the transition of a clock. The output Q of flip-flop 18 is provided to the data input D of flip-flop 12 through inverter 20 to drive flip-flop 12 high to initiate termination of the refresh cycle. Each of the four flip-flops 12, 14, 16 and 18 is driven by a 10 MHz clock signal 22.

Thus, as shown in FIG. 4, upon a REFRESH request, which serves as the clear signal for the four flip-flops 12, 14, 16 and 18 shown in FIG. 3, the staggered refresh signals RAS0-3 are each staggered by one system period clock, 100 nsec. in the illustrated embodiment, as they go low. In other words, during the refresh, RAS0 will go low first, followed one clock period later by RAS1, one clock period later by RAS2, and finally one clock period later by RAS3. The $\overline{RAS}$s will end in a similar manner; RAS0 first, followed one period later by RAS1, one period later by RAS2, and one period later by RAS3.

Thus, by delaying each successive $\overline{RAS}$ by one 100 nsec. clock period, the time required for refreshing at 10 MHz is 700 nsecs., which is equal to 0.7 microseconds. Thus, refreshes are being performed 0.7 microseconds/16 microseconds or 4.4% of the time. Therefore, the staggered refresh technique of the present invention, compared to previous solutions to reduce supply current spikes, requires that 56% less time be devoted to refresh.

It should be understood that various alternatives to the embodiment of the invention shown herein may be employed in practicing the invention, it is intended that the following claims define the invention and that methods and structure within the scope of these claims and their equivalents be covered thereby.

What is claimed is:

1. A refresh circuit for generating a plurality of refresh signals for a dynamic random access memory (DRAM) comprising memory cells subdivided into a plurality of memory cell banks such that the refresh signals are provided to the memory cell banks in one-to-one correspondence to refresh the memory cells comprising the respective memory cell bank, the refresh circuit comprising a plurality of edge-triggered flip-flops connected in series such that the data input signal to successive flip-flops in the series is provided by an output of the previous flip-flop in the series such that successive flip-flops generate a sequence of refresh signals in response to successive cycles of a clock signal commonly connected to each of the flip-flops, the refresh signals being connected to one-to-one correspondence to the memory cell banks and wherein an output of the last flip-flop in the series of flip-flops is provided via an inverter as the data input signal to the first flip-flop in the series to provide sequential termination of the refresh signals on a subsequent sequence of successive cycles of the clock signal.

2. Refresh circuitry for providing refresh signals to the memory cells of a dynamic random access memory (DRAM) wherein an individual memory cell is accessed by application of a corresponding address signal to address inputs of the DRAM in correspondence to cycles of a system clock signal applied to the DRAM, and wherein the memory cells are subdivided into a plurality of memory cell banks and a single refresh signal is periodically provided to each memory cell bank to refresh the memory cells comprising that memory cell bank, the refresh circuitry comprising:

(a) means responsive to the system clock signal for generating a sequence of individual refresh signals, successive individual refresh signals in the sequence being initiated on successive cycles of the system clock signal; and (b) means for sequentially providing each individual refresh signal to a corresponding memory cell bank on successive cycles of the system clock signal and in one-to-one correspondence to the memory cell banks such that refresh of the plurality of memory cell banks is sequentially initiated on successive cycles of the system clock signal.

3. Refresh circuitry as in claim 2 and wherein the means for providing each individual refresh signal to its corresponding memory cell bank includes means for applying each individual refresh signal to its corresponding memory cell bank for a preselected number of cycles of the system clock signal.

4. Refresh circuitry as in claim 3 and further comprising means for terminating application of each individual refresh signal to its corresponding memory cell bank on a subsequent sequence of successive cycles of the system clock signal.

5. A method of refreshing the memory cells of a dynamic random access memory (DRAM) wherein an individual memory cell is accessed by application of a corresponding address signal to address inputs of the DRAM in correspondence to cycles of a system clock signal applied to the DRAM, and wherein the memory cells are subdivided into a plurality of memory cell banks and an individual of the refresh signals is periodically provided to a corresponding memory cell bank to refresh the memory cells comprising that memory cell bank, the method comprising:

(a) generating a sequence of individual refresh signals in response to the system clock signal, successive individual refresh signals in the sequence being initiated on successive cycles of the system clock signal;

(b) providing individual of the refresh signals to its corresponding memory cell bank on successive cycles of the system clock signal and in one-to-one correspondence to the memory cell banks such that refresh of the plurality of memory cell banks is sequentially initiated on successive cycles of the system clock signal.

6. A method as in claim 5 and including the step of applying each individual refresh signal to its corresponding memory cell bank for a preselected number of cycles of the system clock signal.

7. A method as in claim 6 and including the step of terminating application of each individual refresh signal to its corresponding memory cell bank on a subsequent sequence of successive cycles of the system clock signal.

* * * * *

UNITED STATES PATENT AND TRADEMARK OFFICE
CERTIFICATE OF CORRECTION

PATENT NO. : 4,887,240
DATED : 12/12/89
INVENTOR(S) : T.L. Garverick et al.

It is certified that error appears in the above - identified patent and that said Letters Patent is hereby corrected as shown below:

In Col. 2, line 23 "RAS0-3" should be --$\overline{RAS0-3}$--.

In Col. 2, line 26 "RAS0" should be --$\overline{RAS0}$--.

In col. 2, line 27 "RAS1" should be --$\overline{RAS1}$--.

In Col. 2, line 27 "RAS2" should be --$\overline{RAS2}$--.

In Col. 2, line 28 "RAS3" should be --$\overline{RAS3}$--.

In Col. 2, line 29 "RAS0" should be --$\overline{RAS0}$--.

In Col. 2, line 30 "RAS1" should be --$\overline{RAS1}$--.

In Col. 2, line 30 "RAS2" should be --$\overline{RAS2}$--.

In Col. 2, line 31 "RAS3" should be --$\overline{RAS3}$--.

Signed and Sealed this

Ninth Day of October, 1990

*Attest:*

HARRY F. MANBECK, JR.

*Attesting Officer*   *Commissioner of Patents and Trademarks*